US005366844A

United States Patent [19]

Verburgh et al.

[11] Patent Number: 5,366,844

[45] Date of Patent: Nov. 22, 1994

[54] HEAT MODE RECORDING MATERIAL FOR MAKING IMAGES OR DRIOGRAPHIC PRINTING PLATES

[75] Inventors: Yves Verburgh, Puurs; Luc Leenders, Herentals, both of

[73] Assignee: AGFA-Gevaert, N.V., Mortsel,

[21] Appl. No.: 128,244

[22] Filed: Sep. 29, 1993

[30] Foreign Application Priority Data

Sep. 30, 1992 [EP] European Pat. Off. ........ 92203008.5

[51] Int. Cl.[5] .......................... G03C 11/12; G03F 7/26

[52] U.S. Cl. .................................... 430/258; 430/259; 430/262; 430/263; 430/303; 430/326; 430/330; 430/964

[58] Field of Search ............... 430/258, 259, 262, 263, 430/303, 326, 330, 964

[56] References Cited

U.S. PATENT DOCUMENTS

| | | | |
|---|---|---|---|
| 4,293,635 | 10/1981 | Flint et al. | 430/271 |
| 4,463,083 | 7/1984 | Kitajima et al. | 430/330 |
| 4,957,845 | 9/1990 | Isono et al. | 430/303 |

*Primary Examiner*—Richard L. Schilling
*Attorney, Agent, or Firm*—Breiner & Breiner

[57] ABSTRACT

The present invention provides a heat mode recording material comprising on the same side of a non-conductive support a conductive recording layer and an elastomeric image forming layer being non-conductive characterised in that a peelable polymeric film is provided as an outermost layer on the side of said support containing said elastomeric image forming layer.

4 Claims, No Drawings

HEAT MODE RECORDING MATERIAL FOR MAKING IMAGES OR DRIOGRAPHIC PRINTING PLATES

FIELD OF THE INVENTION

The present invention relates to a heat mode recording material having a conductive recording layer and a polymeric cover film to avoid build-up of charges in a package containing such heat mode recording materials.

BACKGROUND OF THE INVENTION

Heat mode recording materials are becoming increasingly more popular due to their ecological advantage and convenience on the one hand and the availability of more powerful exposure devices i.e. lasers. Heat mode recording materials can be used for making e.g. images, color images as well as monochrome images (see e.g. GB-A-2.029.267) or for making lithographic printing plates (see e.g. FR-A-1.473.751).

Typically a heat mode recording material comprises on a support, generally a paper support or organic resin support, a heat mode recording layer and an image forming layer. The image forming layer may be a layer containing e.g. a dye or dye pigment or can be e.g. a silicone layer so that a driographic printing plate can be obtained therewith. The heat mode recording layer is often a thin metallic layer or a layer containing carbon black. Thus the heat mode recording layer is often conductive whereas the image forming layer and support are generally non-conductive. Further the image forming layer is often elastomeric e.g. when the image forming layer contains a silicone rubber.

When such recording materials are piled they become highly charged with electricity, i.a. the pile behaves like a capacitor, so that when someone taking a recording material from a pile of recording materials may experience an electric shock unless special precautions are made.

SUMMARY OF THE INVENTION

It is an object of the present invention to provide heat mode recording materials that when piled do not show a capacitor effect without however impairing the imaging properties of such heat mode recording material.

It is a further object of the present invention to provide a method for obtaining an image and/or lithographic printing plate therewith.

Further objects will become clear from the description hereinafter.

According to the present invention there is provided a heat mode recording material comprising on the same side of a non-conductive support a conductive recording layer and an elastomeric image forming layer being non-conductive characterised in that a peelable polymeric film is provided as an outermost layer on the side of said support containing said elastomeric image forming layer.

According to the present invention there is also provided a method for obtaining an image comprising the steps of:

exposing a heat mode recording material, comprising on the same side of a non-conductive support a conductive recording layer and an elastomeric image forming layer being non-conductive and wherein a peelable polymeric film is provided as an outermost layer on the side of said support containing said elastomeric image forming layer, to actinic radiation thereby causing heating of said heat mode recording material at the exposed areas, peeling said antistatic film and rubbing said recording material to remove said elastomeric image forming layer in said exposed areas.

According to an alternative method of the present invention said peelable polymeric film may be peeled before exposure of said recording material.

DETAILED DESCRIPTION OF THE INVENTION

It has been found that by laminating a peelable polymeric film on top of an elastomeric and non-conductive image forming layer severe electric discharges when taking a recording material out of a pile can be avoided even with non antistatic peelable polymeric films i.e. films of low conductivity. The fact that electric discharges can be avoided in accordance with the present invention is probably due to the fact that the blocking effect which normally occurs between the elastomeric image forming layer of one recording material and the support of another recording material in a pile is set at rest.

Suitable peelable polymeric films for use in accordance with the present invention are e.g. polyester, polycarbonate or polystyrene film, cellulose derivatives, polyolefines, polyvinylchloride, etc. Preferably the peelable polymeric film is metallized or it may be a polymeric film being pigmented with a conductive pigment such as e.g. carbon black, a metal or metal oxide etc. Preferably the peelable polymeric film has a thickness between 3 μm and 100 μm and more preferably between 10 μm and 50 μm. A thin peelable polymeric film offers the advantage that it can be laminated to the recording material without the aid of an adhesive and that it can be easily removed afterwards. However, the peelable polymeric film in connection with the present invention may also be laminated to the recording material using an adhesive provided the adhesive does not cause adverse effects on the imaging properties of the recording material or damage when peeled off.

Depending on the particular application the image forming layer of the heat mode recording material may be a pigmented or colored layer so that a visual image can be obtained or the image forming layer may comprise a substance that can yield an image-wise differentiation in ink receptivity so that a lithographic printing plate may be obtained.

According to a particular embodiment of the present invention the image forming layer is a silicone layer in order to obtain a driographic printing plate. Preferably used silicones are hardened silicone rubbers.

Preferably the silicone rubber contains one or more components one of which is generally a linear silicone polymer terminated with a chemically reactive group at both ends and a multifunctional component as a hardening agent. The silicone rubber can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si—H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are-e.g. U.V. curable coatings containing polysiloxane polymers containing epoxy groups or electron beam curable coatings containing polysiloxane polymers containing (meth)acrylate groups. The latter coatings preferably also contain multifunctional (meth)acrylate monomers.

The thickness of the image forming layer is preferably between 0.1 μm and 3 μm and more preferably between 0.1 μm and 1 μm.

The conductive recording layer in accordance with the present invention is preferably a vapour or vacuum deposited metal layer. Suitable metals are e.g. aluminium, bismuth, tin, indium, tellurium etc. Alternatively the recording layer may be comprised of a metal, metal oxide or carbon black dispersed in a binder. Suitable binders are e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly(meth)acrylates, polyvinyl chloride etc.

Preferably the thickness of the recording layer is not more than 3 μm. In case a vapour or vacuum deposited metal layer is used as a recording layer the thickness thereof is preferably such that the optical density is between 0.5 and 5 and more preferably between 1 and 4.

With the term conductive in connection with the present invention is meant a surface resistance of less than 500 Ohm/square whereas a non-conductive layer in connection with the present invention will have a surface resistance of at least $10^{10}$ Ohm/square.

Suitable non-conductive supports for use in connection with the present invention are organic resin supports, e.g. a polyester film support, a cellulose triacetated support, a polycarbonate film, a polystyrene film etc. or paper, e.g. a organic resin coated paper support.

The heat mode recording material used in accordance with the invention may contain additional layers such as e.g. one or more layers between the support and the recording layer for improving the adhesion of the recording layer to the support or intermediate layers between the image forming layer and recording layer may be provided.

The heat mode recording material in connection with the present invention is preferably exposed using a laser. Preferably used lasers are e.g. semiconductor lasers, YAG lasers e.g. Nd-YAG lasers, Argon lasers etc. The laser may have a power output between 40 and 7500 mW and preferably operates in the infrared part of the spectrum. Rubbing of the image-wise exposed heat mode recording material can be done using a brush, a cotton pad etc. Rubbing of the heat mode recording material in connection with the present invention is preferably carried out without the presence of a liquid. In this way swelling of the image forming layer is avoided and images of good contrast and high density can be obtained. Rubbing may however also be carried out in the presence of a non-solvent for the image forming layer so that swelling thereof may also be avoided.

Removal of the peelable polymeric film may be done before exposure of the heat mode recording material but is preferably done after exposure of the heat mode recording material just before rubbing thereof is carried out. In the latter case, it will be clear that the peelable polymeric film should be sufficiently transparant so as to allow exposure of recording layer. When the support is transparant and the polymeric film is insufficiently transparant exposure of the recording material may then be done through the support.

Keeping the peelable polymeric film on the heat mode recording material just before rubbing is especially advantage when the image forming layer is a silicone rubber. Since a silicone rubber is easily damaged during handeling the peelable polymeric film may provide sufficient protection upto mounting of the recording material onto a printing press. Rubbing of the recording material may then be effected on the mounted recording material.

The present invention will now be illustrated by the following examples without however limiting it thereto. All parts are by weight unless otherwise specified.

EXAMPLE 1

To a polyethylene terephtalate support provided with a primer layer of a copolymer of vinylidenechloride (88 mol %), methylacrylate (10 mol %) and itaconic acid (2 mol %) in an amount of 170 mg/m$^2$ was vacuum deposited a bismuth layer as a recording layer such that the optical density thereof was 4.5 (sheet resistance of about 40 Ohms/Square). To this recording layer was then coated a silicone rubber layer from the below described coating solution, to a dry thickness of 2 μm and cured for 5 min. at 130° C.

Coating solution for the silicone rubber layer:

| Component | Type | Parts by weight |
|---|---|---|
| PS 255 | Base Coating | 22.00 |
| PS 445 | Base Coating | 47.00 |
| Exxsol DSP 80/110 | Solvent | 660.00 |
| Syl-Off 7367 | Crosslinker | 1.90 |
| PC072 | Catalyst System | 0.28 |

PS 255 is a Poly(dimethylsiloxane)-(0.1–0.3%)(methylvinylsiloxane) copolymer gum, obtained from Hüls.

PS 445 is a vinyl terminated dimethylpolysiloxane, supplier Hüls.

Syl-Off 7367 is a solution of 71% of methyl hydrogen polysiloxane in ethynylcyclohexene obtained from Dow Corning.

PC072 is a divinyltetramethyl disiloxane complex of platinum in xylene obtained from Hüls.

Exxsol DSP 80/110 is a naphta i.e. a mixture of paraffins and in which the content of aromatics has been reduced.

On the cured rubber silicone coating was laminated as a peelable polymeric film a 5 μm polyethylene terephtalate film HOSTAPHAN RE5 form Hoechst (sheet resistance of about $10^{14}$ Ohms/Square).

After slitting to the desired dimensions the heat mode recording material sheets were stacked (80 sheets). As a reference was used a pile of 80 sheets of the same heat mode material but without the peelable polymeric film on the silicone rubber surface. The two piles were allowed to stand for a few minutes before taking a heat mode recording sheet from the pile. The heat mode recording sheets with the peelable polymeric film on the silicone rubber surface were very easy to separate and no electrostatic spark discharge was observed. Concerning the reference pile, without the polymeric film on the silicone rubber surface, when taking out a heat mode recording material severe blocking between the sheets was observed together with strong electrostatic spark discharges.

Invention samples were image-wise exposed either through the polymeric film or through the support backside, using a Nd-Yag laser (1024 nm) according to the exposure conditions described in EP 92201633.2. After peeling off the polymeric film and subsequent rubbing with a dry cotton pad to remove the silicone rubber layer in the exposed parts, the samples could be used to print on a printing press without dampening.

EXAMPLE 2

On the silicone rubber surface from the heat mode material described in EXAMPLE 1 was laminated as an overcoat layer a metallized 10 $\mu m$ polyethylene terephatalate film. The metallization was performed by vacuum depositing of an aluminium layer such that the optical density was 0.2 (surface resistance of about 150 Ohms/Square); after laminating the overcoat layer on the silicone rubber surface of the heat mode recording material, the aluminium layer was localized on the outer surface of the overcoat layer. No electrostatic spark discharges were observed when separating the heat mode recording material sheets. The anti-static properties of the overcoat layer allows further to dissipate small amounts of electrostatic charge when separating the heat mode recording material sheets (provided with the overcoat layer) and when peeling off the anti-discharge overcoat layer from the silicone rubber surface as well subsequent to laser recording.

Invention samples were image-wise exposed either through the overcoat layer or through the support backside, using a Nd-Yag laser (1024 nm) according to the exposure conditions described in EP 92201633.2. After removing the overcoat layer and subsequent rubbing with a dry cotton pad to remove the silicone rubber layer in the exposed parts, the samples could be used to print on a printing press without dampening.

EXAMPLE 3

To the polyethylene terephtalate support described in EXAMPLE 1 was vacuum deposited a bismuth layer as a recording layer such that the optical density thereof was 1.7 (surface resistance of about 150 Ohms/Square). To this recording layer was then coated a silicone rubber layer according to the composition described in EXAMPLE 1.

On the cured silicone coating was laminated as an overcoat layer a 5 $\mu m$ polyethylene terephtalate film HOSTAPHAN RE5 (sheet resistance of about $10^{14}$ Ohms/Square) from Hoechst.

After slitting to the desired dimensions the heat mode recording material sheets were stacked (80 sheets). As a reference was used a pile of 80 sheets of the same heat mode material but without overcoat layer on the silicone rubber surface. The two piles were allowed to stand for a few minutes before taking of a heat mode recording sheet from the pile. The heat mode recording sheets with the laminated overcoat layer on the silicone rubber surface were very easy to separate and no electrostatic spark discharges were observed.

Invention samples were image-wise exposed either through the overcoat layer or through the support backside, using a Nd-Yag laser (1024 nm) according the exposure conditions described in EP 92201633.2. After peeling off the overcoat layer and subsequent rubbing with a dry cotton pad to remove the ink repellant layer in the exposed parts, the samples could be used to print on a printing press without dampening.

EXAMPLE 4

To a polyethylene terephtalate support provided with a primer layer of a copolymer of vinylidenechloride (88 mol %), methylacrylate (10 mol %) and itaconic acid (2 mol %) in an amount of 170 mg/m$^2$ was vacuum deposited an aluminium layer as a recording layer such that the optical density thereof was 4.8 (sheet resistance of about 0.6 Ohms/Square). To this conductive recording layer was then coated a silicone rubber layer according to the compositon described in EXAMPLE 1.

On the cured rubber silicone coating was laminated as an overcoat layer a 5$\mu$ polyethylene terephtalate film HOSTAPHAN RE5 from Hoechst.

After slitting to the desired dimensions the heat mode recording material sheets were stacked (80 sheets). As a reference was used a pile of 80 sheets of the same heat mode material but without the overcoat layer on the silicone rubber surface but with an anti-static coating of an acrylic copolymer/silica filler combination on the backside of the polyethylene terephtalate support.

The heat mode recording sheets with the laminated overcoat layer on the silicone rubber surface were very easy to seperate, neither blocking nor electrostatic spark discharges were observed. Concerning the reference pile, without the overcoat layer on the silicone rubber surface but provided with the anti-static coating on the backside of the polyethylene terephtalate support, extensive blocking was observed together with electrostatic spark discharges when trying to separate the sheets.

We claim:

1. A method for making an image comprising the steps of:
   exposing a heat mode recording material comprising on the same side of a non-conductive support a conductive recording layer and an elastomeric image forming layer being non-conductive and a peelable polymeric film provided as an outermost layer on the side of said support containing said elastomeric image forming layer to actinic radiation thereby causing heating of said heat mode recording material at the exposed areas,
   peeling said peelable polymeric film and
   rubbing said recording material to remove said elastomeric image forming layer in said exposed areas.

2. A method for making a driographic printing plate comprising the steps of:
   exposing a heat mode recording material comprising on the same side of a non-conductive support a conductive recording layer and an elastomeric image forming layer being non-conductive and containing a silicone rubber wherein a peelable polymeric film is provided as an outermost layer on the side of said support containing said elastomeric image forming layer to actinic radiation thereby causing heating of said heat mode recording material at the exposed areas, peeling said peelable polymeric film and rubbing said recording material to remove said elastomeric image forming layer in said exposed areas.

3. A method according to claim 1 or 2 wherein said conductive recording layer is a vapour or vacuum deposited metal layer or a layer containing carbon black.

4. A method according to claim 1 or 2 wherein said peelable polymeric film is metallized.

* * * * *

Disclaimer and Dedication 5,366,844 - Yves Verburgh, Puurs; Luc Leenders, Herentals, both of Belgium. HEAT MODE RECORDING MATERIAL FOR MAKING IMAGES OR DRIOGRAPHIC PRINTING PLATES. Patent dated November 22, 1994. Disclaimer and Dedication filed May 14, 1999, by the assignee, AGFA-Gevaert, N.V.

Hereby disclaims and dedicates to the Public the entire term of said patent.

*(Official Gazette,* July 27, 1999)